United States Patent
Choi et al.

(10) Patent No.: US 12,131,920 B2
(45) Date of Patent: Oct. 29, 2024

(54) LASER LIGHT SOURCE AND A LASER CRYSTALLIZATION APPARATUS INCLUDING THE SAME

(71) Applicant: SAMSUNG DISPLAY CO., LTD., Yongin-si (KR)

(72) Inventors: Kyong Sik Choi, Asan-si (KR); Dong Hoon Shin, Cheonan-si (KR); Hoon Chul Ryoo, Cheonan-si (KR); Kyeong Mok Kim, Cheonan-si (KR); Jae-Woong Moon, Asan-si (KR); Kyong Ho Park, Paju-si (KR); Ki Hwan Seok, Pohang-si (KR); Myoung Seok Son, Yongin-si (KR); Hong Ro Lee, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 5 days.

(21) Appl. No.: 18/139,414

(22) Filed: Apr. 26, 2023

(65) Prior Publication Data
US 2023/0260809 A1  Aug. 17, 2023

Related U.S. Application Data

(63) Continuation of application No. 16/874,198, filed on May 14, 2020, now Pat. No. 11,705,348.

(30) Foreign Application Priority Data

Aug. 26, 2019 (KR) .................. 10-2019-0104692

(51) Int. Cl.
| | | |
|---|---|---|
| H01L 21/67 | (2006.01) | |
| H01L 21/02 | (2006.01) | |
| H01S 5/00 | (2006.01) | |

(52) U.S. Cl.
CPC .. *H01L 21/67115* (2013.01); *H01L 21/02675* (2013.01); *H01S 5/0071* (2013.01)

(58) Field of Classification Search
CPC ......... H01L 21/67115; H01L 21/02675; H01L 21/268; H01S 5/0071; H01S 3/0071; H01S 3/08068; H01S 3/139; H01S 3/03; H01S 3/034; H01S 3/041; H01S 2301/20; H01S 3/225; H01S 3/08059; B23K 26/0648; G02B 1/10
See application file for complete search history.

(56) References Cited

U.S. PATENT DOCUMENTS

| | | |
|---|---|---|
| 5,553,093 A | 9/1996 | Ramaswamy et al. |
| 6,134,259 A | 10/2000 | Danziger et al. |
| 2002/0101900 A1 | 8/2002 | Govorkov et al. |

(Continued)

FOREIGN PATENT DOCUMENTS

| | | |
|---|---|---|
| JP | 2662963 | 10/1997 |
| JP | 2005-033126 | 2/2005 |

(Continued)

*Primary Examiner* — John P. Dulka
(74) *Attorney, Agent, or Firm* — F. CHAU & ASSOCIATES, LLC

(57) ABSTRACT

A laser light source is provided including an airtight container. A first resonance mirror and a second resonance mirror are disposed outside the airtight container. The first resonance mirror includes a lens unit and a reflection coating layer. The lens unit includes a first surface and a second surface, and the first surface is inclined with respect to the second surface.

20 Claims, 23 Drawing Sheets

(56) References Cited

U.S. PATENT DOCUMENTS

2003/0227956 A1 12/2003 Scaggs
2004/0266080 A1 12/2004 Jyumonji et al.
2018/0123308 A1 5/2018 Taniyama et al.
2021/0066102 A1 3/2021 Choi et al.

FOREIGN PATENT DOCUMENTS

| JP | 5382975 | 1/2014 |
|----|---------|--------|
| KR | 10-0807678 | 3/2008 |
| KR | 10-1166102 | 7/2012 |
| KR | 10-1357017 | 2/2014 |

LASER LIGHT SOURCE AND A LASER CRYSTALLIZATION APPARATUS INCLUDING THE SAME

CROSS-REFERENCE TO RELATED APPLICATIONS

This application is a continuation of U.S. patent application Ser. No. 16/874,198 filed on May 14, 2020, which claims priority under 35 U.S.C. § 119 to Korean Patent Application No. 10-2019-0104692 filed in the Korean Intellectual Property Office on Aug. 26, 2019, the disclosures of which are incorporated by reference herein in their entireties.

1. TECHNICAL FIELD

The present invention relates to a laser light source and a laser crystallization apparatus including the same.

2. DISCUSSION OF THE RELATED ART

A thin film transistor (TFT) including a semiconductor layer is provided in a pixel of an active driving display device such as an organic light emitting device (OLED) or a liquid crystal display (LCD). The semiconductor layer may be formed of polycrystalline silicon.

The polycrystalline silicon may be formed by irradiating amorphous silicon with a laser light and annealing the amorphous silicon. A laser crystallization apparatus is used in this process. The laser crystallization apparatus may be a gas laser apparatus, for example, an excimer laser apparatus. The laser crystallization apparatus generates laser light by exciting a medium gas by an electrical discharge, amplifies the laser light by resonance, and then outputs the laser light.

The laser light of the laser crystallization apparatus travels along a predetermined line when irradiating the amorphous silicon and regions of the amorphous silicon may be resultantly irradiated with a time difference. If the energy of the laser light of the laser crystallization apparatus is not uniform, the degree of crystallization of the amorphous silicon is different for each region, such that the performance of the TFT or the display device is deteriorated, or streaks are visible to the user.

SUMMARY

According to an exemplary embodiment of the present invention, a laser light source is provided including an airtight container. A first resonance mirror and a second resonance mirror are disposed outside the airtight container. The first resonance mirror includes a lens unit and a reflection coating layer. The lens unit includes a first surface and a second surface, and the first surface is inclined with respect to the second surface.

According to an exemplary embodiment of the present invention, the first surface is disposed between the airtight container and the second surface.

According to an exemplary embodiment of the present invention, the second resonance mirror includes a third surface and a fourth surface, and the fourth surface is inclined with respect to the third surface.

According to an exemplary embodiment of the present invention, the first resonance mirror includes a first point corresponding to a part where the first resonance mirror is thickest from the second surface of lens unit of the first resonance mirror, a second point corresponding to a part where the first resonance mirror is thinnest from the second surface of the lens unit of the first resonance mirror, and a first axis passing through the first point and the second point. The second resonance mirror includes a third point corresponding to a part where the first resonance mirror is thickest from the third surface of the second resonance mirror, a fourth point corresponding to a part where the first resonance mirror is thinnest from the third surface of the second resonance mirror, and a second axis passing through the third point and the fourth point. An angle between the first axis and the second axis is 80° to 100°.

According to an exemplary embodiment of the present invention, the reflection coating layer is disposed on the second surface of the lens unit of the first resonance mirror.

According to an exemplary embodiment of the present invention, the reflection coating layer is disposed inside the lens unit between the first surface and the second surface of the lens unit of the first resonance mirror.

According to an exemplary embodiment of the present invention, the reflection coating layer is disposed on the first surface of the lens unit of the first resonance mirror.

According to an exemplary embodiment of the present invention, the third surface of the second resonance mirror is disposed between the fourth surface of the second resonance mirror and the airtight container.

According to an exemplary embodiment of the present invention, the second resonance mirror includes a third surface and a fourth surface facing each other, and the third surface and the fourth surface are parallel to each other.

According to an exemplary embodiment of the present invention, the first surface of the lens unit of the first resonance mirror is spiral.

According to an exemplary embodiment of the present invention, the first surface of the lens unit of the first resonance mirror includes a plurality of inclined surfaces that are not parallel to each other.

According to an exemplary embodiment of the present invention, a laser crystallization apparatus is provided including a laser light source for generating laser light. A stage is mounted with a substrate. The laser light source includes an airtight container, a first resonance mirror disposed outside the airtight container, and a second resonance mirror disposed outside the airtight container. The first resonance mirror includes a lens unit and a reflection coating layer. The lens unit includes a first surface and a second surface facing each other, and the first surface is inclined with respect to the second surface.

According to an exemplary embodiment of the present invention, the second resonance mirror includes a third surface and a fourth surface facing each other, and the fourth surface is inclined with respect to the third surface.

According to an exemplary embodiment of the present invention, the first resonance mirror includes a first point corresponding to a part where the first resonance mirror is thickest from the second surface of the lens unit of the first resonance mirror, a second point corresponding to a part where the first resonance mirror is thinnest from the second surface of the lens unit first resonance mirror, and a first axis passing through the first point and the second point. The second resonance mirror includes a third point corresponding to a part where the first resonance mirror is thickest from the third surface of the second resonance mirror, a fourth point corresponding to a part where the first resonance mirror is thinnest from the third surface of the second resonance mirror, and a second axis passing through the third point and the fourth point. An angle between the first axis and the second axis is 80° to 100°.

According to an exemplary embodiment of the present invention, a first beam splitter is provided that reflects a first part of the laser light output from the laser light source and transmits a second part of the laser light output from the laser light source. A second beam splitter is provided for reflecting a third part of the laser light passing through the first beam splitter and transmitting a fourth part of the laser light. A laser light intensity sensing unit measures a pulse intensity of the first part of the laser light reflected from the first beam splitter. A first monitoring unit is provided for photographing a focus image of the third part of the laser light reflected from the second beam splitter. A second monitoring unit is provided for photographing a fifth part of the laser light that irradiates the substrate. A controller is provided for adjusting an angle between the first axis of the first resonance mirror and the second axis of the second resonance mirror.

According to an exemplary embodiment of the present invention, a first optical system includes a beam splitter disposed on a proceeding path of the laser light output from the laser light source. A first mirror is disposed on a proceeding path of the laser light passing through the beam splitter. A second mirror is disposed on a proceeding path of the laser light reflected from the first mirror. The laser light passing through the beam splitter and reflected from the first mirror and the second mirror is incident to the beam splitter.

According to an exemplary embodiment of the present invention, a second optical system is provided. The second optical system includes a first beam splitter disposed on a proceeding path of the laser light output from the laser light source. A second beam splitter is disposed on a proceeding path of a first part of the laser light passing through the first beam splitter. A plurality of mirrors are provided reflecting a second part of the laser light reflected from the first beam splitter towards the second beam splitter.

According to an exemplary embodiment of the present invention, a Dove prism is disposed on a proceeding path of the laser light output from the laser light source, the Dove prism includes a trapezoid shape.

According to an exemplary embodiment of the present invention, a laser light source is provided including a container. A first resonance mirror is provided. A second resonance mirror is disposed outside the airtight container facing the first resonance mirror. A first surface and a second surface of the first resonance mirror facing each other are not parallel, and a first surface and a second surface of the second resonance mirror facing each other are not parallel.

According to an exemplary embodiment of the present invention, a thickest portion of the first resonance mirror and a thickest portion of the second resonance mirror face each other.

BRIEF DESCRIPTION OF THE DRAWINGS

The above and other features of the present invention will become more apparent by describing in detail exemplary embodiments of the present invention thereof with reference to the accompanying drawings in which.

DETAILED DESCRIPTION OF THE EMBODIMENTS

Figure 1:
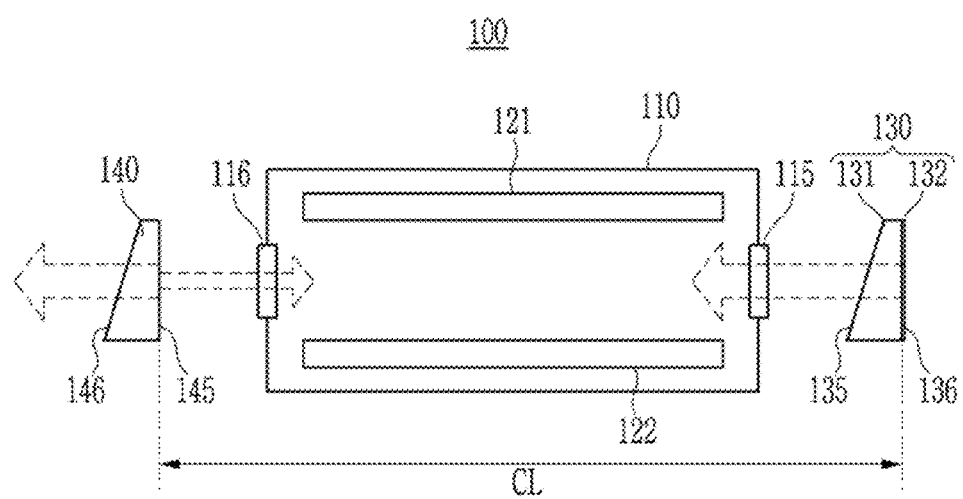
FIG. 1 is a schematic diagram of a laser light source according to an exemplary embodiment of the present invention.

The present invention will be described more fully hereinafter with reference to the accompanying drawings, in which exemplary embodiments of the present invention are shown. Like reference numerals may refer to like elements throughout this application.

In the drawings, the thickness of layers, films, panels, regions, etc., may be exaggerated for clarity. It will be understood that when an element such as a layer, film, region, or substrate is referred to as being "on" another element, it can be directly on the other element or intervening elements may also be present.

Figure 2:
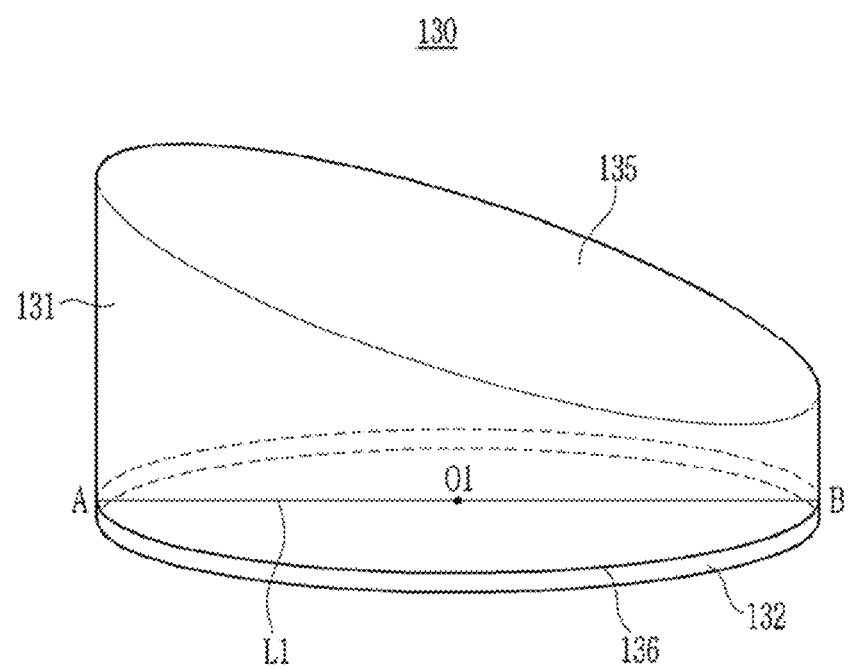
FIG. 2 is a perspective view of a first resonance mirror including a laser light source according to an exemplary embodiment of the present invention.
Figure 3:
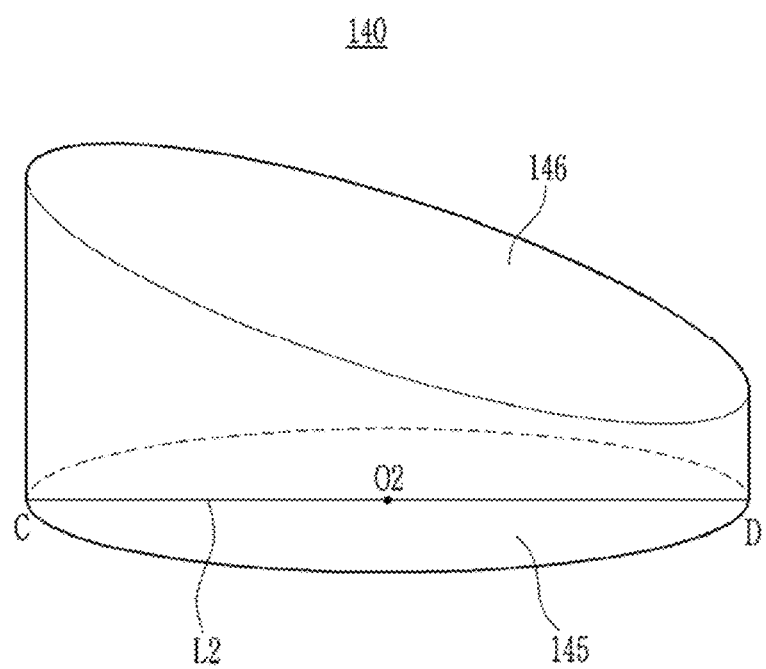
FIG. 3 is a perspective view of a third resonance mirror included in a laser light source according to an exemplary embodiment of the present invention.
Figure 4:
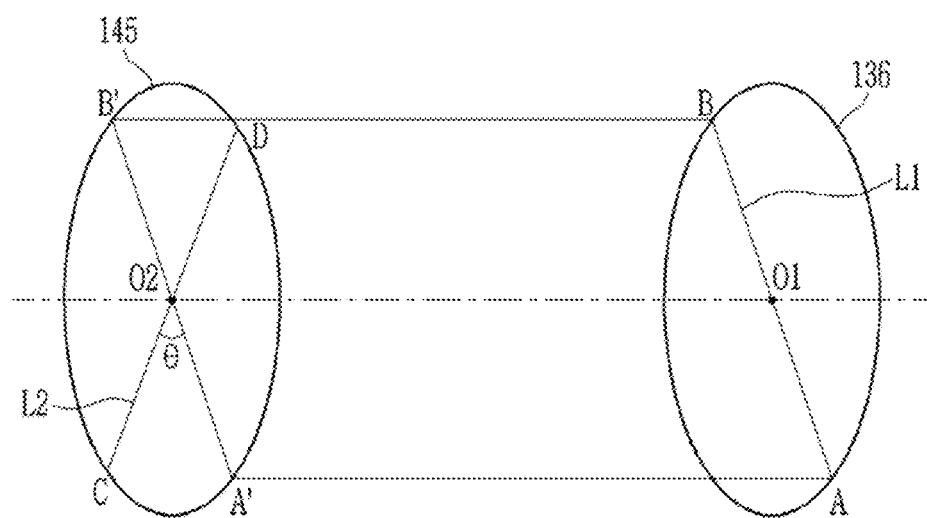
FIG. 4 is a schematic diagram representing a position relationship of a first resonance mirror and a second resonance mirror.

First, a laser light source 100 according to an exemplary embodiment of the present invention is described with reference to FIG. 1 to FIG. 4. FIG. 1 is a schematic diagram of a laser light source according to an exemplary embodiment of the present invention. FIG. 2 is a perspective view of a first resonance mirror 130 including a laser light source 100 according to an exemplary embodiment of the present invention. FIG. 3 is a perspective view of a second resonance mirror 140 included in a laser light source 100 according to an exemplary embodiment of the present invention. FIG. 4 is a schematic diagram showing a position relationship of a first point A of the first resonance mirror 130 and a third point C of the second resonance mirror 140.

Referring to FIG. 1, a laser light source 100 according to an exemplary embodiment of the present invention includes an airtight container 110 in which a medium gas is sealed, a first electrode 121 and a second electrode 122 disposed inside the airtight container 110, and a laser resonance unit (130 and 140) disposed outside the airtight container 110.

The airtight container 110 may include a tube, and the medium gas inside the airtight container 110 may include an excimer. For example, the medium gas may include at least one of neon (Ne), krypton (Kr), argon (Ar), and xenon (Xe). Depending on the type of gas molecules, the wavelength of the laser light generated may be determined.

The first electrode 121 and the second electrode 122 may be disposed facing each other inside the airtight container 110. For example, the first electrode 121 and the second electrode 122 may be disposed in parallel to each other. One of the first electrode 121 and the second electrode 122 may be grounded, and the other may be applied with a high voltage. When voltages are applied to the first electrode 121 or the second electrode 122, a discharge starts in the space between the first electrode 121 and the second electrode 122. Therefore, the laser light may be generated by repeatedly amplifying the light generated when the energy level of electrons of atoms or molecules of the medium gas is excited and then lowered again.

A first transparent window 115 and a second transparent window 116 are respectively disposed at opposite ends of the airtight container 110. The first transparent window 115 and the second transparent window 116 face each other and may transmit laser light. For example, the first transparent window 115 and the second transparent window 116 may be aligned laser ports disposed at parallel sides of the airtight container 110. The first transparent window 115 and the second transparent window 116 may include glass, sapphire, or the like, and may include an anti-reflective coating layer on the surface thereof to increase transmittance.

The laser resonance unit (130 and 140) includes the first resonance mirror 130 facing the first transparent window 115 outside the airtight container 110 and the second resonance mirror 140 facing the second transparent window 116 outside the airtight container 110.

Referring to FIG. 2, the first resonance mirror 130 includes a lens unit 131 and a reflection coating layer 132.

Light generated in the airtight container 110 may pass through the first transparent window 115 and through the lens unit 131 of the first resonance mirror 130. The lens unit 131 of the first resonance mirror 130 includes a first surface 135 and a second surface 136 facing each other. The first surface 135 of the lens unit 131 of the first resonance mirror 130 may be a surface facing the first transparent window 115. The first surface 135 of the lens unit 131 of the first resonance mirror 130 may be disposed closer to the airtight container 110 relative to the second surface 136. The first surface 135 and the second surface 136 of the lens unit 131 may not be parallel, and the first surface 135 may have an inclined surface that is inclined at an angle with respect to the second surface 136.

The first resonance mirror 130 includes a first point A corresponding to a portion where the thickness of the first resonance mirror 130 is thickest in a direction extending perpendicularly from the second surface 136 of the lens unit 131. The first resonance mirror 130 may have a second point B corresponding to a portion where the thickness of the first resonance mirror 130 is thinnest in the direction extending perpendicularly from the second surface 136 of the first resonance mirror 130. A first axis L1 connects the first point A and the second point B. The second surface 136 may be circular, and the first axis L1 may pass through the center point O1 of the second surface 136. For example, the first point A and the second point B may represent points on the circumference of the second surface 136 spaced apart by a diameter of the second surface 136.

The lens unit 131 of the first resonance mirror 130 may include at least one of fused silica, magnesium fluoride ($MgF_2$), aluminum oxide ($Al_2O_3$), and silicon oxide ($SiO_2$).

The reflection coating layer 132 is disposed on the second surface 136 of the lens unit 131. Light transmitted through the lens unit 131 of the first resonance mirror 130 may be reflected by the reflection coating layer 132. The reflection coating layer 132 is integrally formed with the lens unit 131 so that the reflection coating layer 132 may be in contact with the second surface 136 of the lens unit 131. The reflection coating layer 132 of the first resonance mirror 130 may have reflectance of 99% or more.

The reflection coating layer 132 of the first resonance mirror 130 may include at least one among hafnium oxide ($HfO_2$), aluminum oxide ($Al_2O_3$), silicon oxide ($SiO_2$). Also, the reflection coating layer 132 of the first resonance mirror 130 may include a multi-layer of hafnium oxide ($HfO_2$) and silicon oxide ($SiO_2$), or a multi-layer of aluminum oxide ($Al_2O_3$) and silicon oxide ($SiO_2$).

Referring to FIG. 3, the second resonance mirror 140 may be a low reflection mirror in which reflectance is lower than transmittance. For example, the second resonance mirror 140 may have transmittance of approximately 90% or more.

The second resonance mirror 140 includes a third surface 145 and a fourth surface 146 facing each other. The third surface 145 of the second resonance mirror 140 may be a surface facing the second transparent window 116. The third surface 145 of the second resonance mirror 140 may be disposed closer to the airtight container 110 relative to the fourth surface 146. The third surface 145 and the fourth surface 146 of the second resonance mirror 140 may not be parallel, and the fourth surface 146 of the second resonance mirror 140 may be an inclined surface with a predetermined angle with respect to the third surface 145. If one surface of the second resonance mirror 140 is configured as the inclined surface, external light may be prevented from being reflected from the second resonance mirror 140 or transmitted through the second resonance mirror 140 to be incident into the airtight container 110. The second surface 136 of the first resonance mirror 130 and the third surface 145 of the second resonance mirror 140 may be spaced apart by a cavity length CL.

The second resonance mirror 140 includes a third point C corresponding to a portion in which the thickness of the second resonance mirror 140 is thickest in a direction extending perpendicularly from the third surface 145 of the second resonance mirror 140. The second resonance mirror 140 includes a fourth point D corresponding to a portion in which the thickness of the second resonance mirror 140 is thinnest in a direction extending perpendicularly from the third surface 145 of the second resonance mirror 140. A second axis L2 connects the third point C and the fourth point D. The third surface 145 may be circular, and the second axis L2 may pass through the center point O2 of the third surface 145. For example, the third point C and the fourth point D may represent points on the circumference of the third surface 145 spaced apart by a diameter of the third surface 145.

The second resonance mirror 140 may include at least one among fused silica, magnesium fluoride ($MgF_2$), aluminum oxide ($Al_2O_3$), and silicon oxide ($SiO_2$).

The laser light transmitted through the first transparent window 115 from the inside of the airtight container 110 is reflected by the reflection coating layer 132 of the first resonance mirror 130, and proceeds into the airtight container 110. A first part of the laser light transmitted from the interior of the airtight container 110 through the second transparent window 116 is reflected by the second resonance mirror 140 and proceeds into the airtight container 110, and the second part thereof passes through the second resonance mirror 140. The laser light is amplified by resonance from the first part traveling between the first resonance mirror 130 and the second resonance mirror 140. The amplified laser light may be output from the laser light source 100 through the second resonance mirror 140.

Referring to FIG. 4, the first resonance mirror 130 and the second resonance mirror 140 facing each other may be offset by an angle θ between the first axis L1 and the second axis L2 of between 80° to 100°. If the positions of the first point A (a point where the thickness is thickest in the first resonance mirror 130) and the third point C (a point where the thickness is thickest in the second resonance mirror 140) are disposed to be crossed, the interference intensity of the laser light generated at the laser resonance unit (130 and 140) may be mitigated. In addition, the energy uniformity of the laser light is increased and the energy asymmetry of the laser light may be decreased.

The second resonance mirror 140, which is disposed on the side where the laser light is output among two mirrors constituting the laser resonance unit (130 and 140), may also be referred to herein as an output coupler mirror.

The laser light source 100 may include a fan motor and a cooling pipe coupled to the airtight container 110. The fan motor may circulate the medium gas in the airtight container 110, and the cooling pipe may cool the medium gas by heat-exchanging the medium gas with the cooling water.

Figure 5:
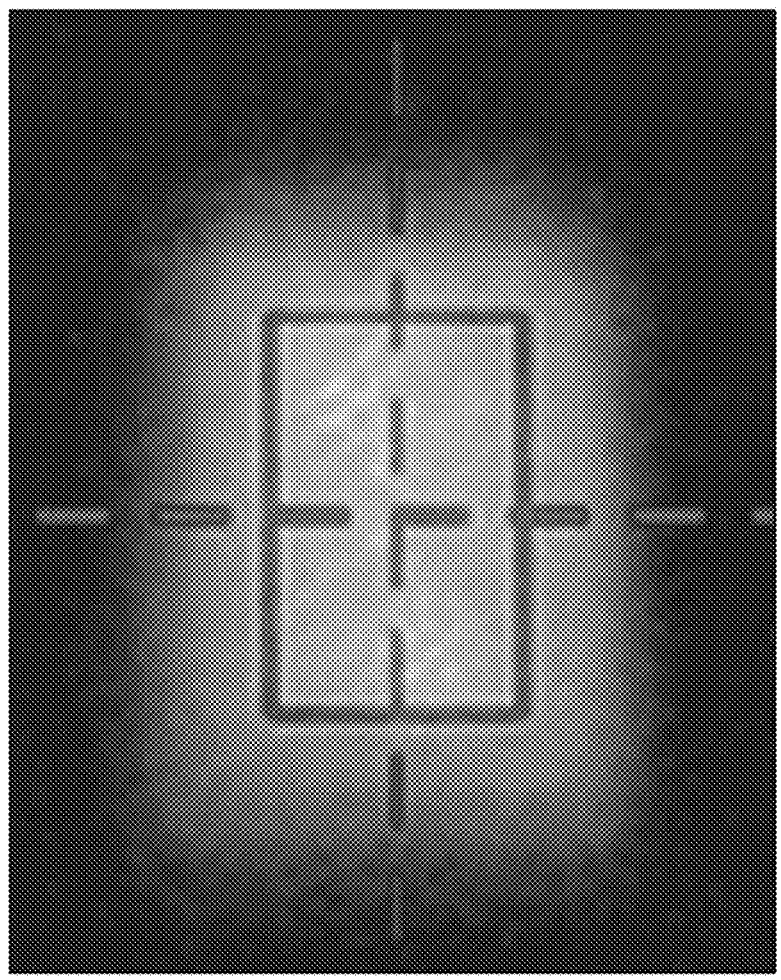
FIG. 5 is a plan view showing an image of a laser light output from a laser light source according to a comparative example.

FIG. 5 is an image of the laser light output from the laser light source according to a comparative example including a first resonance mirror in which the first surface and the second surface are parallel. Referring to FIG. 5, it may be seen that an interference pattern is generated of a diagonal shape extended in one direction from the laser light output from the laser light source, according to the comparative example. For example, bands of the interference pattern are capable of being discerned in the comparative example of the laser light source output of FIG. 5.

Figure 6:
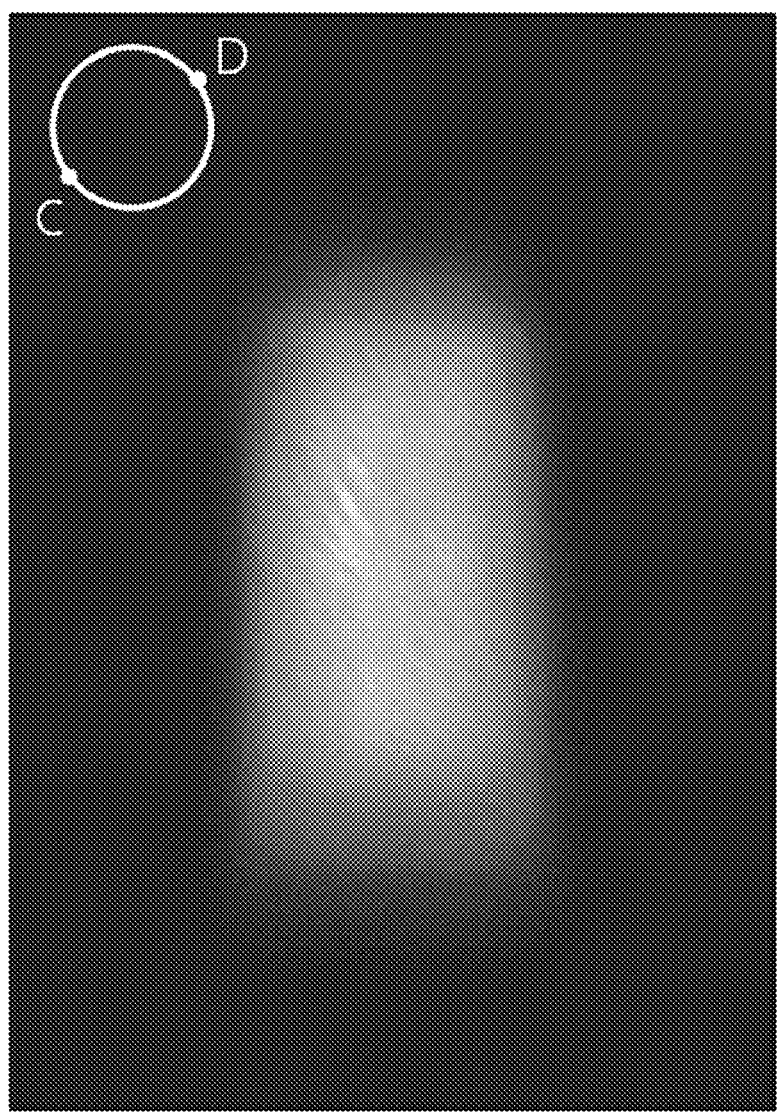
FIG. 6 is a plan view showing an interference pattern image of a second resonance mirror of FIG. 3.

FIG. 6 is the interference pattern image by the second resonance mirror 140 of FIG. 3. In FIG. 6, the third point C of the second resonance mirror 140 is disposed at the left bottom. In this case, it may be seen that the interference pattern of the laser light is a straight line extending in the direction crossing the axis passing through the third point C and the fourth point D.

Figure 7:
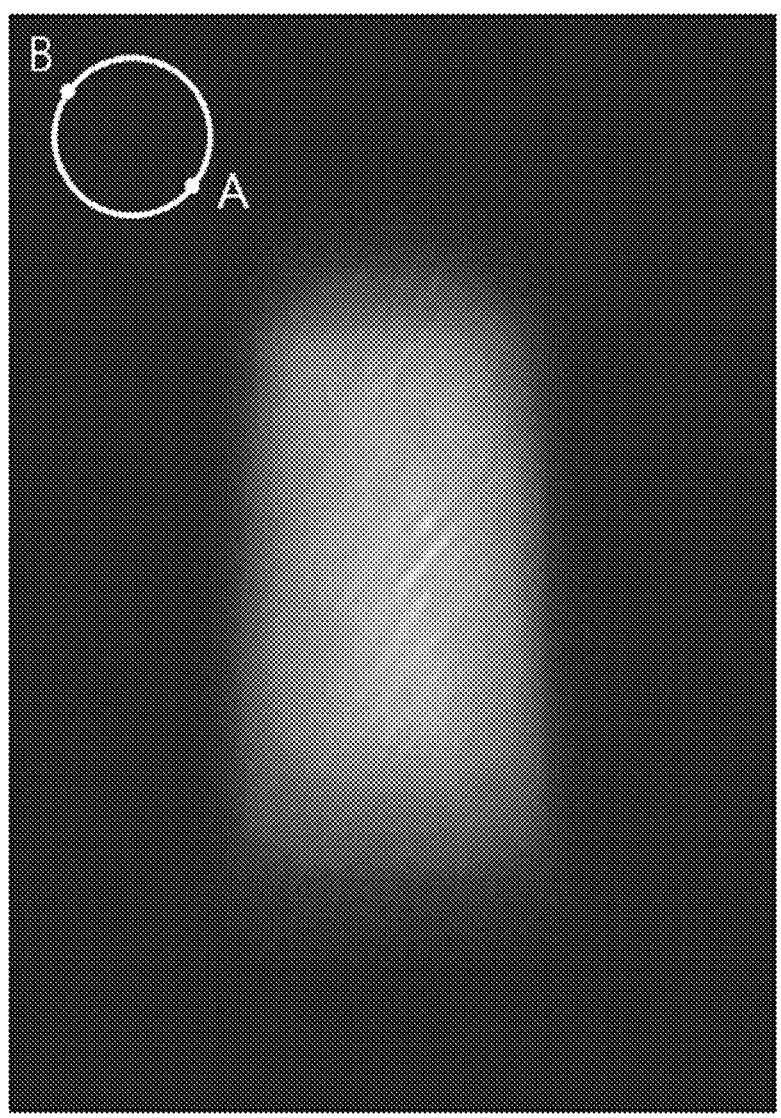
FIG. 7 is a plan view showing an interference pattern image of a first resonance mirror of FIG. 2.

FIG. 7 is an interference pattern image of the first resonance mirror 130 of FIG. 2. In FIG. 7, the first point A of the first resonance mirror 130 is disposed at the right bottom. In FIG. 7, the axis passing through the first point A and the second point B of the first resonance mirror 130 may form an angle of 90° with the axis passing through the third point C and the fourth point D of the second resonance mirror 140 in FIG. 6. In FIG. 7, the interference pattern of the laser light has a straight shape extending in the direction crossing the axis passing through the first point A and the second point B.

Referring to FIG. 6 and FIG. 7, it may be seen that the interference pattern of the second resonance mirror 140 and the interference pattern of the first resonance mirror 130 are left and right symmetrical. Therefore, by disposing the first resonance mirror 130 and the second resonance mirror 140 together so that the angle between the first axis L1 of the first resonance mirror 130 and the second axis L2 of the second resonance mirror 140 is between 80° to 100°, the interference intensity of the laser light may be reduced.

Figure 8:
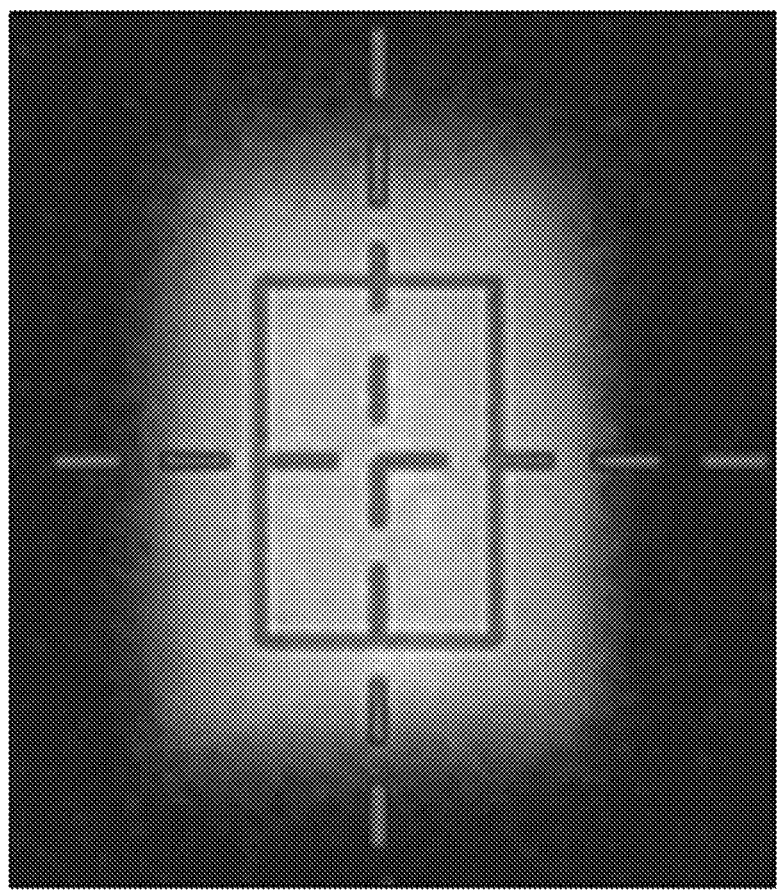
FIG. 8 is a plan view showing an image of a laser light output from a laser light source according to an exemplary embodiment of the present invention.

FIG. 8 is an image of the laser light output from the laser light source 100 according to an exemplary embodiment of the present invention. In detail, the laser light source 100 according to an exemplary embodiment of the present invention is the same as the laser light source 100 of FIG. 1, and the first resonance mirror 130 and the second resonance mirror 140 are disposed so that the angle between the first axis L1 of the first resonance mirror 130 and the second axis L2 of the second resonance mirror 140 is between 80° to 100°. Referring to FIG. 8, in contrast to the comparative example of FIG. 5, in the image of the laser light output from the laser light source 100 according to an exemplary embodiment of the present invention, the interference pattern is not recognizable.

Figure 9:
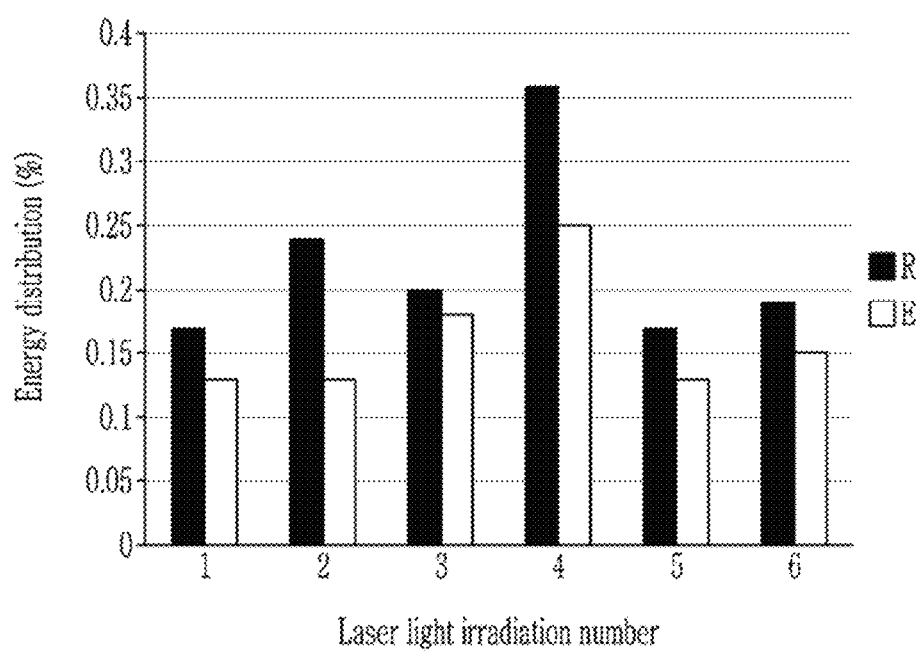
FIG. 9 is a graph showing a percentage of energy distribution of laser light output from a laser light source according to a comparative example and an exemplary embodiment of the present invention.
Figure 10:
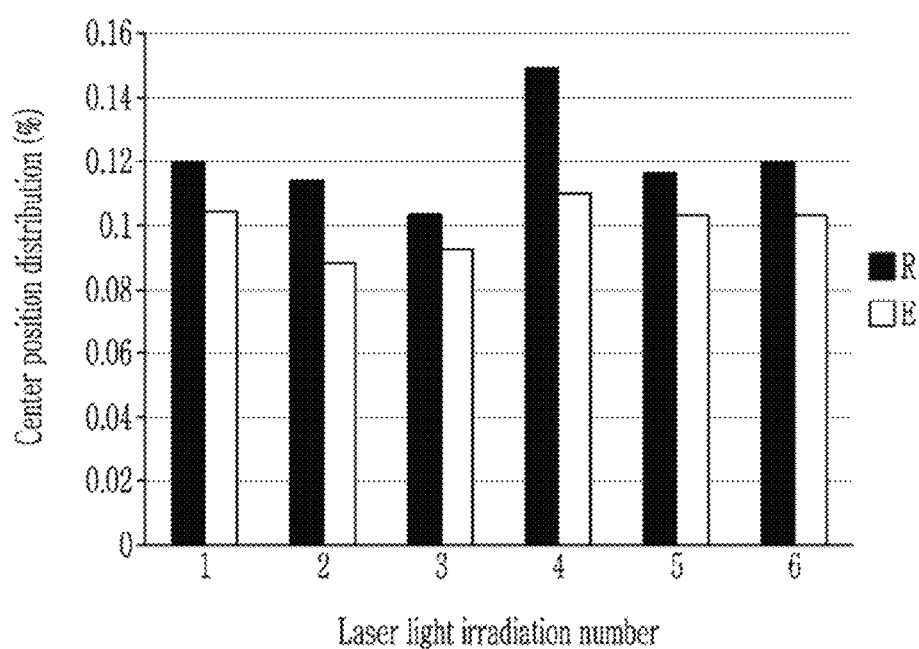
FIG. 10 is a graph showing a percentage of center position distribution of laser light output from a laser light source according to a comparative example and an exemplary embodiment of the present invention.

FIG. 9 is a graph showing a percentage of energy distribution of laser light output from a laser light source according to a comparative example and an exemplary embodiment of the present invention, and FIG. 10 is a graph showing a percentage of center position distribution of laser light output from a laser light source according to a comparative example and an exemplary embodiment of the present invention.

Referring to FIG. 9, the percentage of energy distribution of the laser light output from the laser light source according to a comparative example R, including the first resonance mirror in which the first surface and the second surface are parallel, is larger than the percentage of energy distribution of the laser light output from the laser light source 100 according to an exemplary embodiment of the present invention E.

Referring to FIG. 10, a percentage center position distribution of the laser light output from the laser light source according to a comparative example R, including a first resonance mirror in which the first surface and the second surface are parallel, is larger than a percentage of center position distribution of the laser light output from the laser light source 100 according to an exemplary embodiment of the present invention E. In other words, it may be confirmed that the energy asymmetry of the laser light output from the laser light source 100 according to an exemplary embodiment of the present invention E is decreased.

In the case of the laser light output from the laser light source 100 according to an exemplary embodiment of the present invention, the intensity of the interference is alleviated, thereby increasing the energy uniformity of the laser light and decreasing the energy asymmetry of the laser light.

Figure 11:
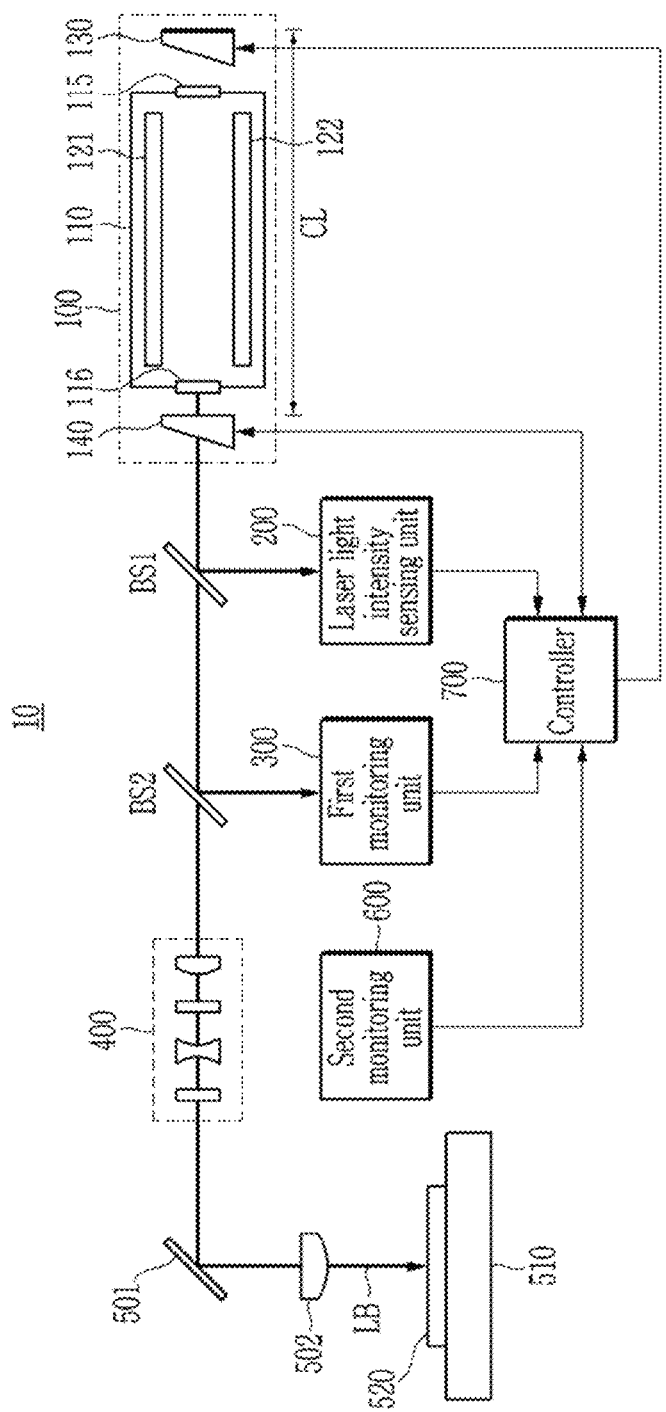
FIG. 11 is a schematic diagram showing a laser crystallization apparatus according to an exemplary embodiment of the present invention.

The laser crystallization apparatus 10 according to an exemplary embodiment of the present invention is described with reference to FIG. 11. FIG. 11 is a schematic diagram representing a laser crystallization apparatus 10 according to an exemplary embodiment of the present invention.

The laser crystallization apparatus 10 according to an exemplary embodiment of the present invention includes a laser light source 100, a laser light intensity sensing unit 200, a first monitoring unit 300, a stage 510, a second monitoring unit 600, and a controller 700.

The laser light source 100 of the laser crystallization apparatus 10 according to an exemplary embodiment of the present invention may be the same as the laser light source 100 of FIG. 1.

A first beam splitter BS1 is disposed on the proceeding path of the laser light LB output from the laser light source 100. For example, a plane of the first beam splitter BS1 may be disposed at an angle with respect to a trajectory of the laser light LB incident thereon. A first part of the laser light LB output from the laser light source 100 is reflected by the first beam splitter BS1 and proceeds to the laser light intensity sensing unit 200. For example, the first part of the laser light LB may be reflected in a perpendicular direction relative to the trajectory of the laser light LB incident on the first beam splitter BS1. A second part of the laser light LB output from the laser light source 100 passes through the first beam splitter BS1. The laser light intensity sensing unit 200 may measure the pulse intensity of the first part of the laser light LB with respect to time.

A second beam splitter BS2 is disposed on the proceeding path of the second part of the laser light LB passing through the first beam splitter BS1. A third part of the laser light LB passing through the first beam splitter BS1 is reflected by the second beam splitter BS2 and proceeds to the first monitoring unit 300. A fourth part of the laser light LB passing through the first beam splitter BS1 passes through the second beam splitter BS2. The first monitoring unit 300 captures the focus image of the third part of the laser light LB to measure the energy distribution or the focus position of the laser light LB.

An optical system 400 is disposed on the proceeding path of the fourth part of the laser light LB transmitted through the second beam splitter BS2. The optical system 400 may include a plurality of lenses or mirrors. The optical system 400 may adjust the laser light LB so that the laser light LB generated from the laser light source 100 satisfies the parameters required for processing the substrate 520.

The fourth part of the laser light LB passing through the optical system 400 is reflected by a first mirror 501, collected by a light collecting lens 502, and irradiates onto a substrate 520 disposed on the stage 510.

The substrate 520 may include an amorphous silicon layer. The laser crystallization apparatus 10 according to an exemplary embodiment of the present invention irradiates the substrate 520 with a fifth part of the laser light LB, thereby crystallizing the amorphous silicon layer of the substrate 520 into a polycrystalline silicon layer.

The second monitoring unit 600 may include a charge-coupled device (CCD) camera, and photographs the fifth part of the laser light LB that irradiates the substrate 520 to determine the state of the fifth part of the laser light LB that irradiates the substrate 520.

The information for the laser light LB obtained by the laser light intensity sensing unit 200, the first monitoring unit 300, and the second monitoring unit 600 may be transmitted to the controller 700. The controller 700 may adjust the position of the first resonance mirror 130 and the second resonance mirror 140 based on the information obtained from the laser light intensity sensing unit 200, the first monitoring unit 300, and the second monitoring unit 600. The controller 700 may rotate the first resonance mirror 130 or the second resonance mirror 140, or adjust the interval between the first resonance mirror 130 and the second resonance mirror 140. For example, the controller may adjust an angle between the first axis of the first resonance mirror and the second axis of the second resonance mirror.

Figure 12:
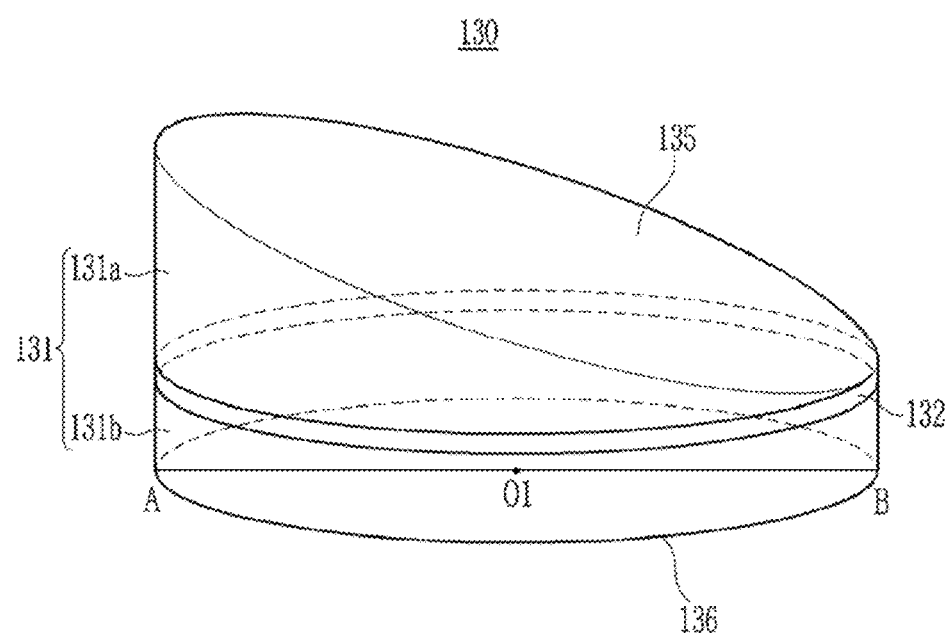
FIG. 12 is a perspective view of a first resonance mirror included in a laser light source according to an exemplary embodiment of the present invention.

FIG. 12 is a perspective view of the first resonance mirror 130 included in the laser light source 100 according to an exemplary embodiment of the present invention.

Referring to FIG. 12, the first resonance mirror 130 includes a lens unit 131 and a reflection coating layer 132. The laser light may pass through the lens unit 131 of the first resonance mirror 130 and may be reflected by the reflection coating layer 132.

The lens unit 131 of the first resonance mirror 130 includes the first surface 135 and the second surface 136 facing each other. The first surface 135 of the lens unit 131 of the first resonance mirror 130 is the surface facing the first transparent window 115. The first surface 135 of the lens unit 131 of the first resonance mirror 130 may be disposed closer to the airtight container 110 relative to the second surface 136. The first surface 135 of the lens unit 131 may be a surface that is inclined at an angle with respect to the second surface 136.

The reflection coating layer 132 may be disposed between the first surface 135 and the second surface 136 of the lens unit 131. The reflection coating layer 132 may be parallel to the second surface 136 of the lens unit 131. The lens unit 131 may include a first portion 131a including the first surface 135 of the lens unit 131 and a second portion 131b including the second surface 136 of the lens unit 131. The reflection coating layer 132 may be disposed between the first portion 131a and the second portion 131b.

The first resonance mirror 130 includes a first point A corresponding to a part where the thickness of the first resonance mirror 130 is thickest in the direction extending perpendicularly from the second surface 136 of the first resonance mirror 130. A second point B corresponds to a part where the thickness of the first resonance mirror 130 is thinnest in the direction extending perpendicularly from second surface 136 of the first resonance mirror 130. A first axis L1 connects the first point A and the second point B. The second surface 136 may be circular, and the first axis L1 may pass through the center point O1 of the second surface 136.

When the first resonance mirror 130 of FIG. 12 faces the second resonance mirror 140 of FIG. 3, the angle θ between the first axis L1 of the first resonance mirror 130 and the second axis L2 of the second resonance mirror 140 may be between 80° to 100°.

Figure 13:
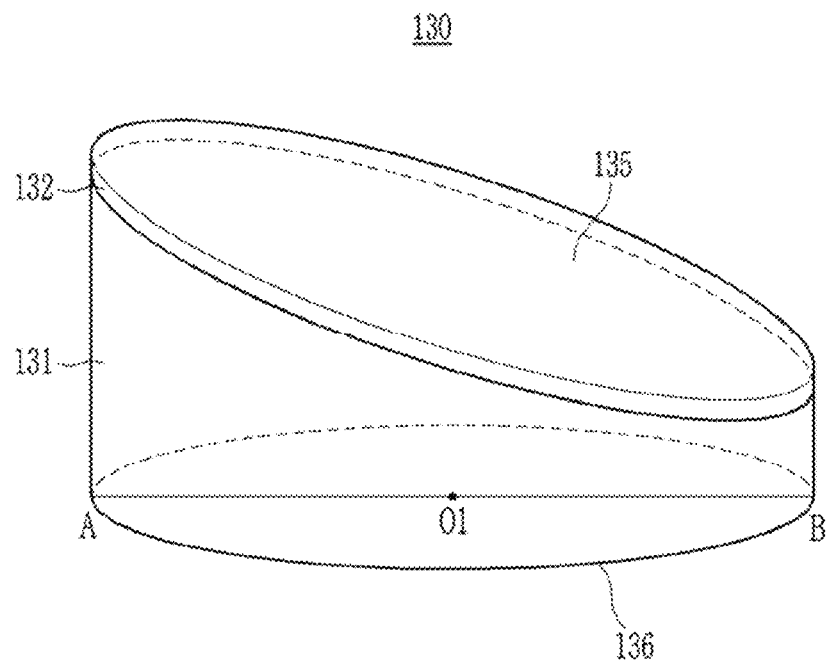
FIG. 13 is a perspective view of a first resonance mirror included in a laser light source according to an exemplary embodiment of the present invention.

FIG. 13 is a perspective view of the first resonance mirror 130 included in the laser light source 100 according to an exemplary embodiment of the present invention.

Referring to FIG. 13, the first resonance mirror 130 includes the lens unit 131 and the reflection coating layer 132.

The lens unit 131 of the first resonance mirror 130 includes the first surface 135 and the second surface 136.

The first surface 135 of the lens unit 131 of the first resonance mirror 130 is the surface facing the first transparent window 115. The first surface 135 of the lens unit 131 of the first resonance mirror 130 may be disposed closer to the airtight container 110 relative to the second surface 136. The first surface 135 of the lens unit 131 may be an inclined surface forming an angle with respect to the second surface 136. The reflection coating layer 132 may be disposed on the first surface 135 of the lens unit 131 and may be in contact with the first surface 135. For example, the first surface 135 may be disposed between the reflection coating layer 132 and the second surface 136. The reflection coating layer 132 may be disposed in parallel to the sloped first surface 135 and may be externally exposed.

The first resonance mirror 130 includes a first point A corresponding to the part where the thickness of the first resonance mirror 130 is thickest in the direction extending perpendicularly from the second surface 136 of the first resonance mirror 130. A second point B corresponds to the part where the thickness of the first resonance mirror 130 is thinnest in the direction extending perpendicularly from the second surface 136 of the first resonance mirror 130. A first axis L1 connects the first point A and the second point B. The second surface 136 may be circular, and the first axis L1 may pass through the center point O1 of the second surface 136.

When the first resonance mirror 130 of FIG. 13 faces the second resonance mirror 140 of FIG. 3, the angle θ between the first axis L1 of the first resonance mirror 130 and the second axis L2 of the second resonance mirror 140 may be between 80° to 100°.

Figure 14:
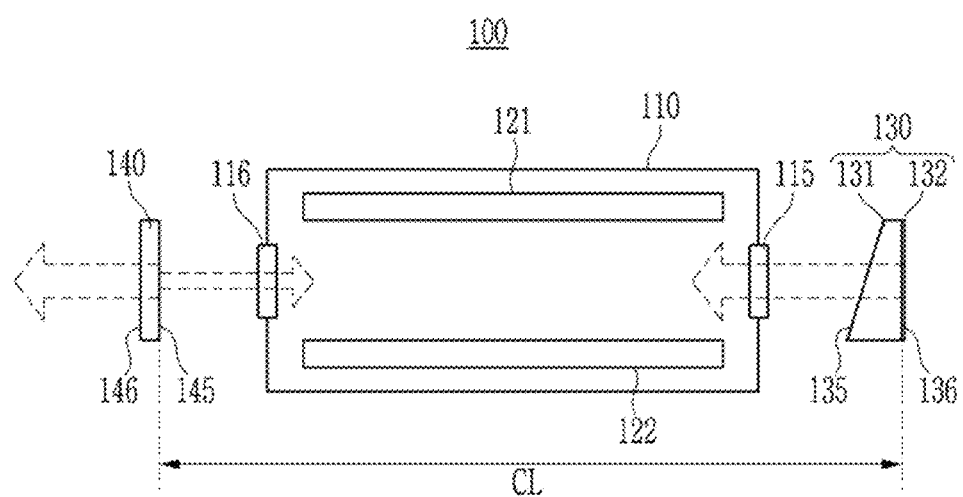
FIG. 14 is a schematic diagram of a laser light source according to an exemplary embodiment of the present invention.

FIG. 14 is a schematic diagram of the laser light source 100 according to an exemplary embodiment of the present invention. The laser light source 100 of FIG. 14 is similar to the laser light source 100 of FIG. 1 except for the shape of the second resonance mirror 140.

Referring to FIG. 14, the laser light source 100 according to an exemplary embodiment of the present invention includes the airtight container 110 in which the medium gas is sealed, the first electrode 121 and the second electrode 122 disposed inside the airtight container 110, and the laser resonance unit (130 and 140) disposed outside the airtight container 110.

The laser resonance unit (130 and 140) includes the first resonance mirror 130 facing the first transparent window 115 outside the airtight container 110, and the second resonance mirror 140 facing the second transparent window 116 outside the airtight container 110.

The second resonance mirror 140 includes the third surface 145 and the fourth surface 146 facing each other. The fourth surface 146 of the second resonance mirror 140 may be the surface facing the second transparent window 116, and may be closer to the airtight container 110 relative to the third surface 145. The third surface 145 and the fourth surface 146 may be parallel.

Figure 15:
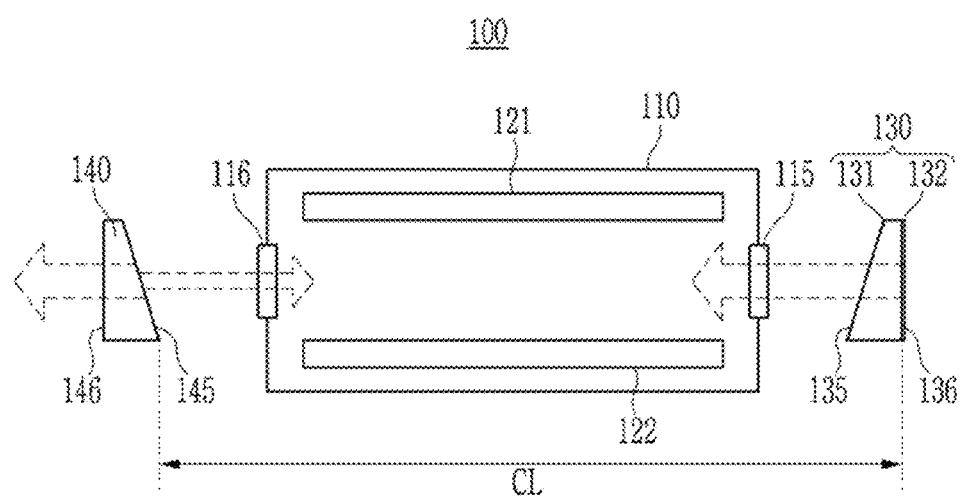
FIG. 15 is a schematic diagram of a laser light source according to an exemplary embodiment of the present invention.

FIG. 15 is a schematic diagram of the laser light source 100 according to an exemplary embodiment of the present invention. The laser light source 100 of FIG. 15 is similar to the laser light source 100 of FIG. 1 except for the profile of the second resonance mirror 140.

Referring to FIG. 15, the laser light source 100 according to an exemplary embodiment of the present invention includes the airtight container 110 in which the medium gas is sealed inside, the first electrode 121 and the second electrode 122 disposed inside the airtight container 110, and the laser resonance unit (130 and 140) disposed outside the airtight container 110.

The laser resonance unit (130 and 140) includes the first resonance mirror 130 facing the first transparent window 115 outside the airtight container 110, and the second resonance mirror 140 facing the second transparent window 116 outside the airtight container 110.

The second resonance mirror 140 includes the third surface 145 and the fourth surface 146 facing each other. The third surface 145 of the second resonance mirror 140 may be the surface facing the second transparent window 116, and may be closer to the airtight container 110 relative to the fourth surface 146. The third surface 145 may be an inclined surface forming an angle with respect to the fourth surface 146. For example, the third surface 145 may be sloped FIG. 16 is a perspective view of the first resonance mirror 130 included in the laser light source 100 according to an exemplary embodiment of the present invention.

Figure 16:
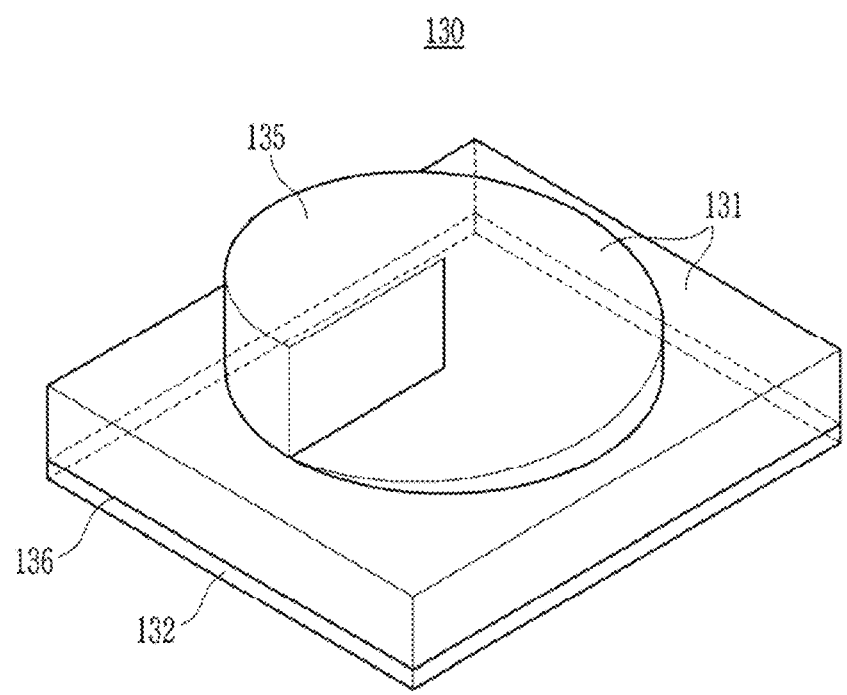
FIG. 16 is a perspective view of a first resonance mirror included in a laser light source according to an exemplary embodiment of the present invention.

Referring to FIG. 1 and FIG. 16, the lens unit 131 of the first resonance mirror 130 includes the first surface 135 and the second surface 136 facing each other. The first surface 135 of the lens unit 131 of the first resonance mirror 130 may be the surface facing the first transparent window 115, and may be closer to the airtight container 110 relative to the second surface 136. The first surface 135 of the lens unit 131 may be an inclined surface forming an angle with respect to the second surface 136. The first surface 135 of the lens unit 131 may be a clockwise or counterclockwise ascending spiral in which the thickness is gradually thickened in a direction perpendicular to the second surface 136. The reflection coating layer 132 is disposed on the second surface 136 of the lens unit 131. It is described that the reflection coating layer 132 is disposed on the second surface 136 of the lens unit 131, however it may be disposed between the first surface 135 and the second surface 136 of the lens unit 131 or may be disposed on the first surface 135.

Figure 17:
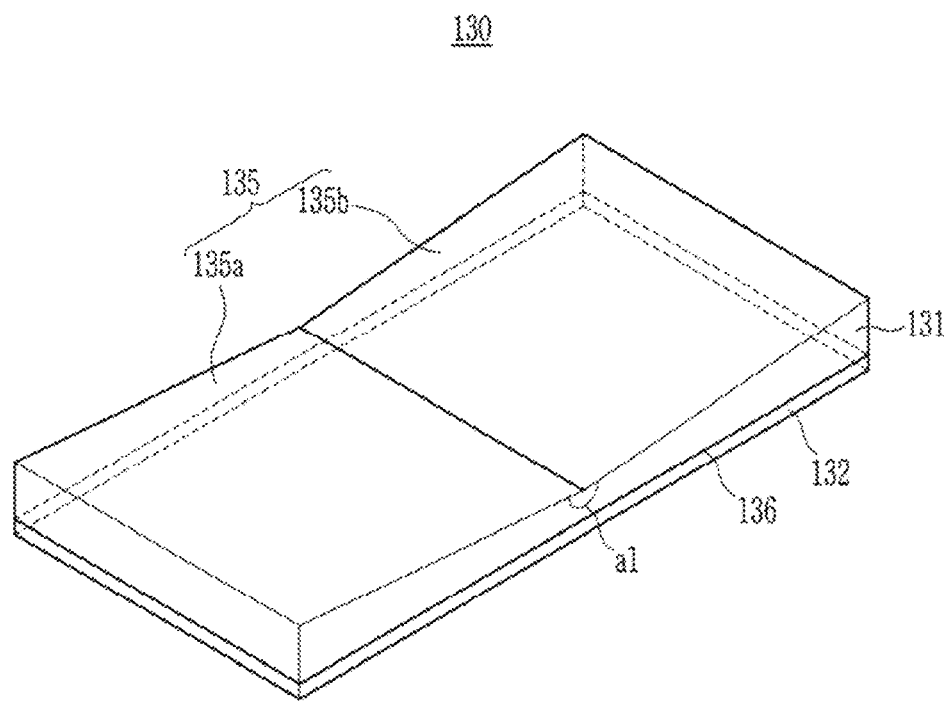
FIG. 17 is a perspective view of a first resonance mirror included in a laser light source according to an exemplary embodiment of the present invention.

FIG. 17 is a perspective view of the first resonance mirror 130 included in the laser light source 100 according to an exemplary embodiment of the present invention.

Referring to FIG. 1 and FIG. 17, the lens unit 131 of the first resonance mirror 130 includes the first surface 135 and the second surface 136 facing each other. The first surface 135 of the lens unit 131 of the first resonance mirror 130 may be a surface facing the first transparent window 115, and may be disposed closer to the airtight container 110 relative to the second surface 136.

The first surface 135 of the lens unit 131 may be an inclined surface that is inclined with respect to the second surface 136. The first surface 135 of the lens unit 131 includes a first inclined surface 135a and a second inclined surface 135b. The first inclined surface 135a and the second inclined surface 135b are not parallel. The part where the first inclined surface 135a and the second inclined surface 135b of the lens unit 131 meet may have a minimum thickness. For example, the interface formed between first inclined surface 135a and the second inclined surface 135b may form a line parallel to a short side of the first resonance mirror 130 which bisects the second surface 136. The first inclined surface 135a and the second inclined surface 135b may be gradually inclined in a direction moving away from the middle of the second surface 136 toward parallel short sides. An angle a1 formed between the first inclined surface 135a and the second inclined surface 135b may be greater than 180° and less than 360°.

The reflection coating layer 132 is disposed on the second surface 136 of the lens unit 131. It is described that the reflection coating layer 132 is disposed on the second surface 136 of the lens unit 131, however it may be disposed between the first surface 135 and the second surface 136 of the lens unit 131, or may be disposed on the first surface 135.

Figure 18:
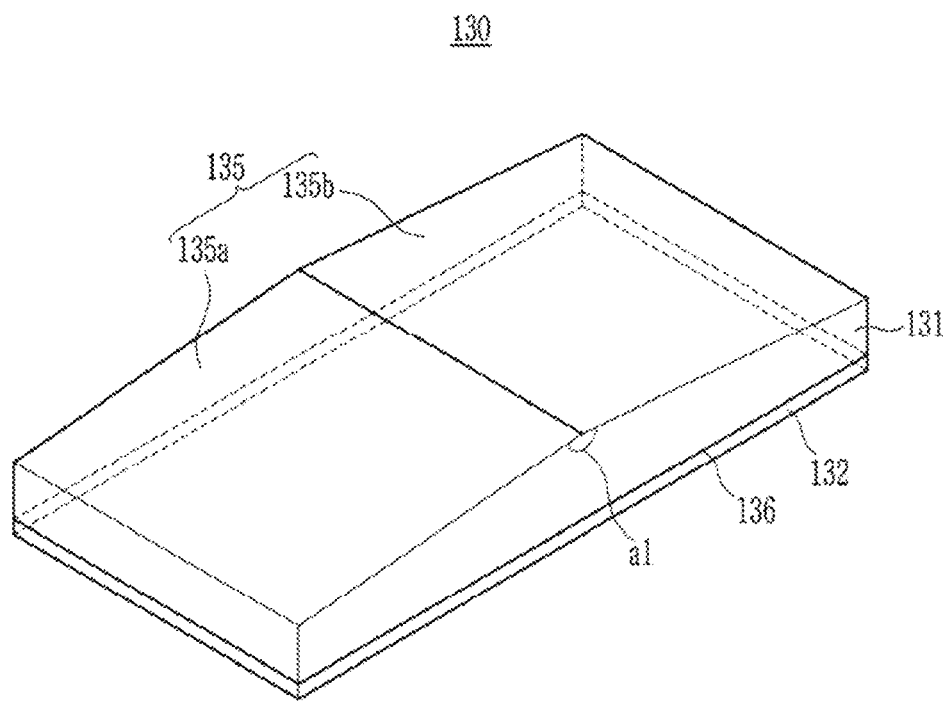
FIG. 18 is a perspective view of a first resonance mirror included in a laser light source according to an exemplary embodiment of the present invention.

FIG. 18 is a perspective view of the first resonance mirror 130 included in the laser light source 100 according to an exemplary embodiment of the present invention.

Referring to FIG. 1 and FIG. 18, the lens unit 131 of the first resonance mirror 130 includes the first surface 135 and the second surface 136 facing each other. The first surface 135 of the lens unit 131 of the first resonance mirror 130 may be the surface facing the first transparent window 115, and may be the surface closer to the airtight container 110 relative to the second surface 136.

The first surface 135 of the lens unit 131 may be an inclined surface that is inclined with respect to the second surface 136. The first surface 135 of the lens unit 131 includes the first inclined surface 135a and the second inclined surface 135b. The first inclined surface 135a and the second inclined surface 135b are not parallel. The part where the first inclined surface 135a and the second inclined surface 135b of the lens unit 131 meet may be the thickest portion of the lens unit 131. For example, the interface between the first inclined surface 135a and the second inclined surface 135b may form a line bisecting the second surface 136, and the lens unit 131 may have a maximum thickness in the direction extending perpendicularly from the second surface 136 at the interface. For example, a thickness of the lens unit 131 may increase in a direction from parallel edges of the second surface 136 toward a center line thereof. The angle a1 between the first inclined surface 135a and the second inclined surface 135b may be greater than 0° and less than 180°.

The reflection coating layer 132 is disposed on the second surface 136 of the lens unit 131. It is described that the reflection coating layer 132 is disposed on the second surface 136 of the lens unit 131, however it may be disposed between the first surface 135 and the second surface 136 of the lens unit 131, or may be disposed on the first surface 135.

Figure 19:
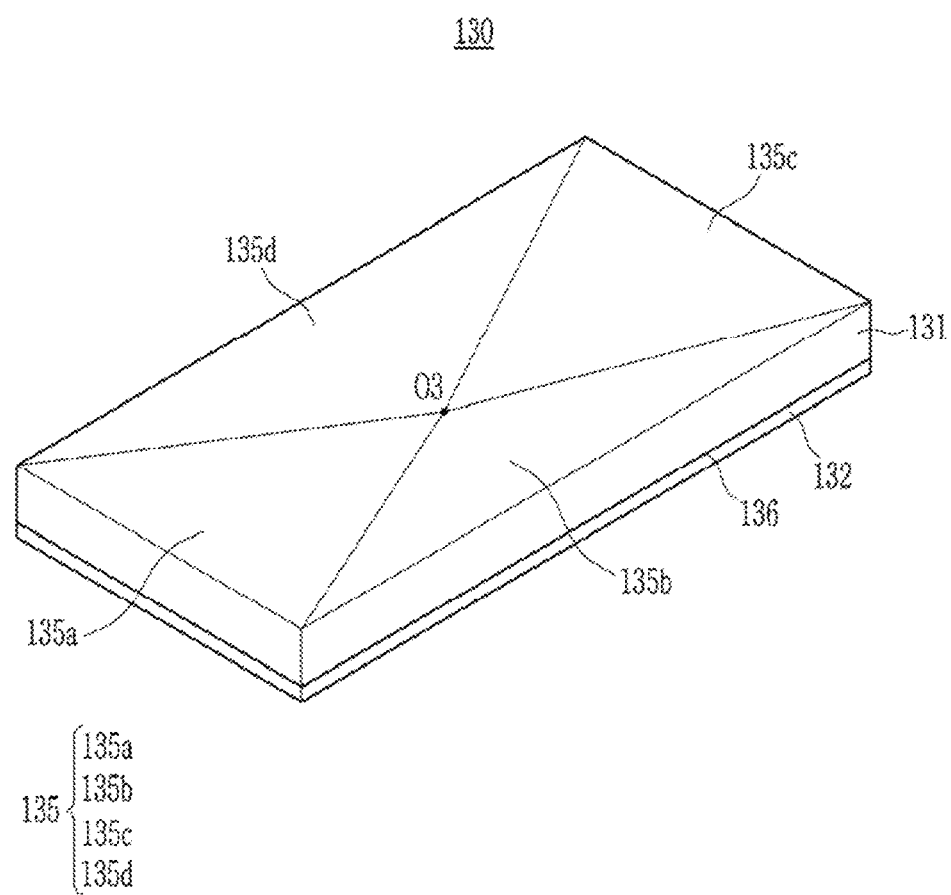
FIG. 19 is a perspective view of a first resonance mirror included in a laser light source according to an exemplary embodiment of the present invention.

FIG. 19 is a perspective view of the first resonance mirror 130 included in the laser light source 100 according to an exemplary embodiment of the present invention.

The lens unit 131 of the first resonance mirror 130 includes the first surface 135 and the second surface 136 facing each other. The first surface 135 of the lens unit 131 of the first resonance mirror 130 may be the surface facing the first transparent window 115, and may be disposed closer to the airtight container 110 relative to the second surface 136.

The first surface 135 of the lens unit 131 includes the first inclined surface 135a, the second inclined surface 135b, a third inclined surface 135c, and a fourth inclined surface 135d. The first inclined surface 135a, the second inclined surface 135b, the third inclined surface 135c, and the fourth inclined surface 135d are not parallel to each other. On the point O3 where the first inclined surface 135a, the second inclined surface 135b, the third inclined surface 135c, and the fourth inclined surface 135d of the lens unit 131 all meet, the thickness of the lens unit 131 may be at a minimum thickness in the direction perpendicularly extending from the second surface 136.

The reflection coating layer 132 is disposed on the second surface 136 of the lens unit 131. It is described that the reflection coating layer 132 is disposed on the second surface 136 of the lens unit 131, however it may be disposed between the first surface 135 and the second surface 136 of the lens unit 131, or may be disposed on the first surface 135.

Figure 20:
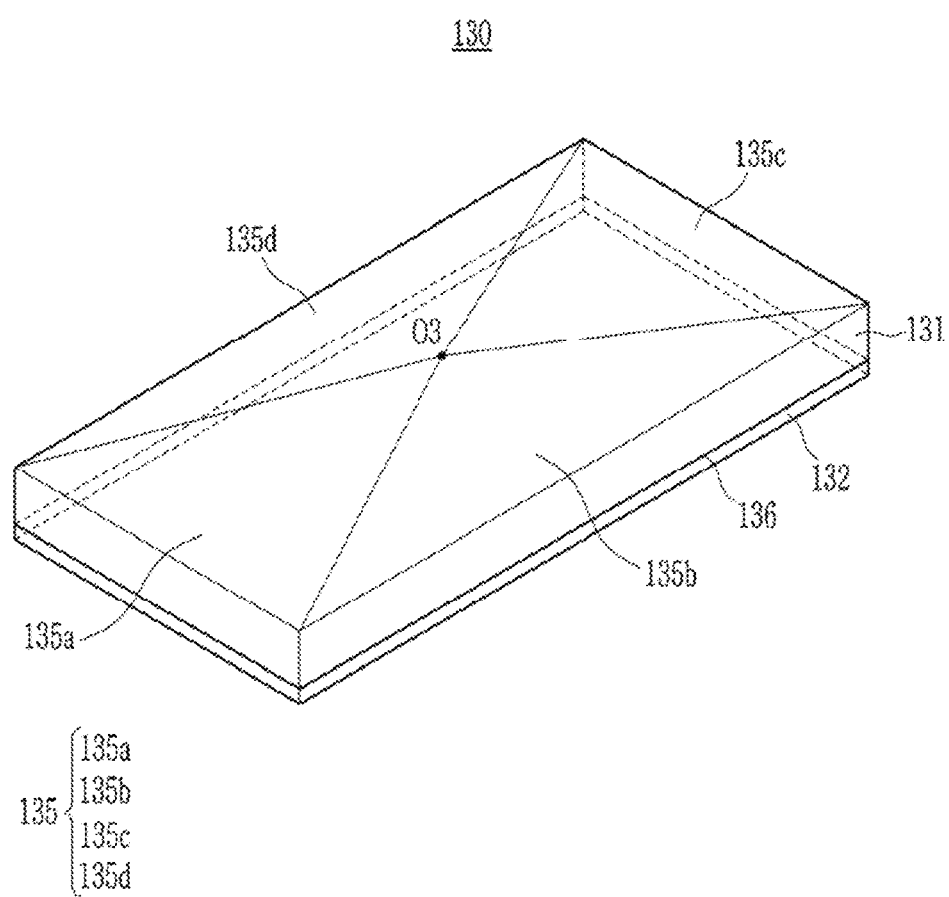
FIG. 20 is a perspective view of a first resonance mirror included in a laser light source according to an exemplary embodiment of the present invention.

FIG. 20 is a perspective view of the first resonance mirror 130 included in the laser light source 100 according to an exemplary embodiment of the present invention.

The lens unit 131 of the first resonance mirror 130 includes the first surface 135 and the second surface 136 facing each other. The first surface 135 of the lens unit 131 of the first resonance mirror 130 may be the surface facing the first transparent window 115, and may be disposed closer to the airtight container 110 relative to the second surface 136.

The first surface 135 of the lens unit 131 includes the first inclined surface 135a, the second inclined surface 135b, the third inclined surface 135c, and the fourth inclined surface 135d. The first inclined surface 135a, the second inclined surface 135b, the third inclined surface 135c, and the fourth inclined surface 135d are not parallel to each other. On the point O3 where the first inclined surface 135a, the second inclined surface 135b, the third inclined surface 135c, and the fourth inclined surface 135d of the lens unit 131 all meet, the thickness of the lens unit 131 may be thinnest compared to other parts of the lens unit 131. The first inclined surface 135a and the third inclined 135c may be mirror symmetrical about a first axis passing through point O3 and parallel to a short side of the first resonance mirror 130. The second inclined surface 135b and the fourth inclined 135d may be mirror symmetrical about a second axis passing through point O3 and parallel to a long side of the first resonance mirror 130. For example, the first and second axes may be perpendicular to one another.

The reflection coating layer 132 is disposed on the second surface 136 of the lens unit 131. It is described that the reflection coating layer 132 is disposed on the second surface 136 of the lens unit 131, however it may be disposed between the first surface 135 and the second surface 136 of the lens unit 131, or may be disposed on the first surface 135.

Figure 21:
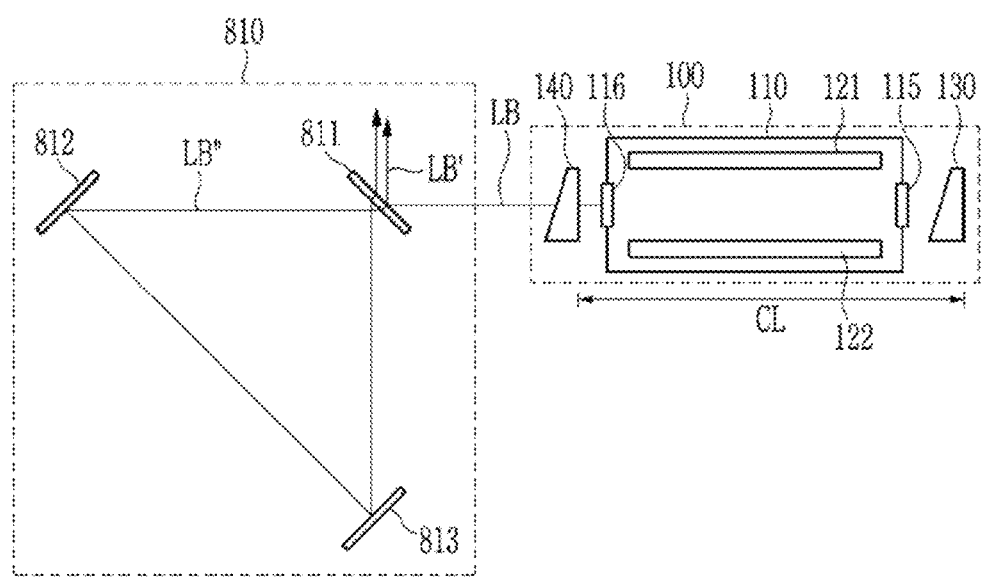
FIG. 21 is a schematic diagram of a laser crystallization apparatus according to an exemplary embodiment of the present invention.

Next, a laser crystallization apparatus according to an exemplary embodiment of the present invention is described with reference to FIG. 21. FIG. 21 is a schematic diagram of a laser crystallization apparatus according to an exemplary embodiment of the present invention.

Referring to FIG. 21, the laser crystallization apparatus according to an exemplary embodiment of the present invention includes the laser light source 100 and a first optical system 810. The first optical system 810 includes a third beam splitter 811, a second mirror 812, and a third mirror 813.

The laser light source 100 may be the laser light source 100 of FIG. 1. Part of the laser light LB (e.g., first laser light LB') output from the laser light source 100 is reflected from the third beam splitter 811, and the remainder (e.g., second laser light LB") passes through the third beam splitter 811 and is reflected sequentially at the second mirror 812 and the third mirror 813. The laser light reflected from the third mirror 813 passes through the first beam splitter 811. The first laser light LB' reflected from the third beam splitter 811 and second laser light LB" passing through the third beam splitter 811 are mixed. For example, the first laser light LB' reflected from the third beam splitter 811 and the second laser light LB" that passes through the first beam splitter 811 may be parallel rays. A time difference may be exhibited between the first laser light LB' and the second laser light LB" corresponding to the difference of a proceeding path length. In other words, the first optical system 810 may further reduce the intensity of the interference by dividing and remixing the laser light output from the laser light source 100.

Figure 22:
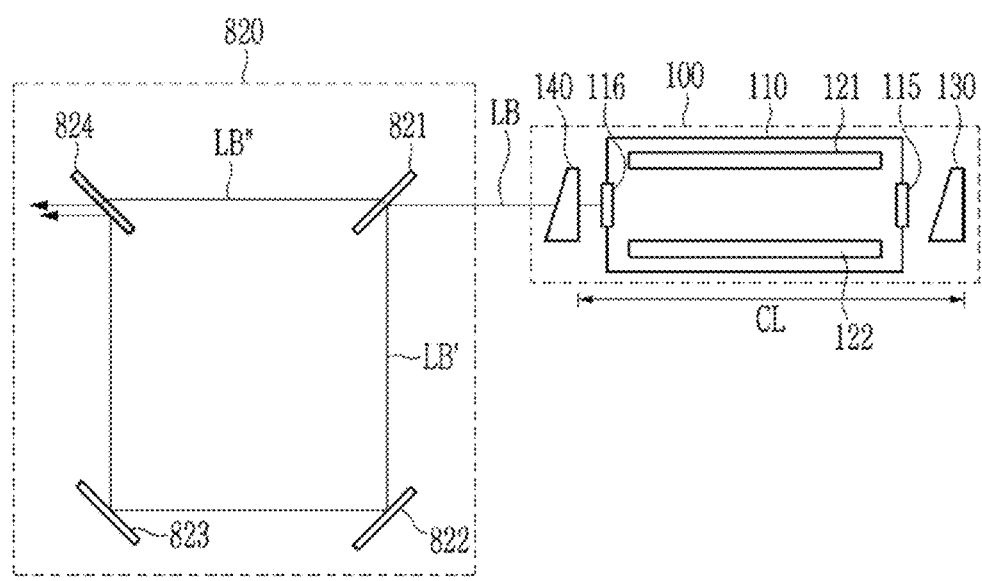
FIG. 22 is a schematic diagram of a laser crystallization apparatus according to an exemplary embodiment of the present invention.

Next, a laser apparatus according to an exemplary embodiment of the present invention is described with reference to FIG. 22. FIG. 22 is a schematic diagram of a laser apparatus according to an exemplary embodiment of the present invention.

Referring to FIG. 22, a laser crystallization apparatus according to an exemplary embodiment of the present invention includes the laser light source 100 and a second optical system 820. The second optical system 820 includes a fourth beam splitter 821, a beam combiner 824, a fourth mirror 822, and a fifth mirror 823.

The laser light source 100 may be the laser light source 100 of FIG. 1. Part of the laser light LB output from the laser light source 100 is reflected by the fourth beam splitter 821, and the remainder of the laser light LB passes through the fourth beam splitter 821. Second laser light LB" passing through the fourth beam splitter 821 passes through the beam combiner 824. First laser light LB' reflected from the fourth beam splitter 821 is sequentially reflected from the fourth mirror 822, the fifth mirror 823, and the beam combiner 824. The second laser light LB" and the first laser light LB' are mixed in the beam combiner 824 with a time difference corresponding to a difference of the proceeding path length. In other words, the second optical system 820 may further reduce the intensity of interference by dividing and remixing the laser light output from the laser light source 100.

Figure 23:
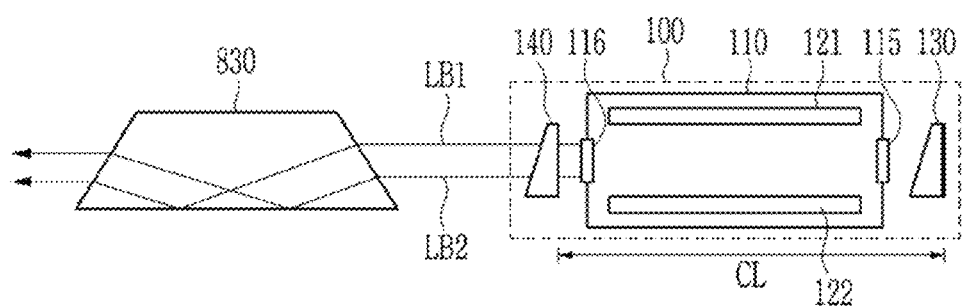
FIG. 23 is a schematic diagram of a laser crystallization apparatus according to an exemplary embodiment of the present invention.

Next, a laser crystallization apparatus according to an exemplary embodiment of the present invention is described with reference to FIG. 23. FIG. 23 is a schematic diagram of a laser apparatus according to an exemplary embodiment of the present invention.

Referring to FIG. 23, the laser crystallization apparatus according to an exemplary embodiment of the present invention includes the laser light source 100 and a Dove prism 830. The Dove prism 830 may be a prism having a trapezoid shape.

The laser light source 100 may be the laser light source 100 of FIG. 1. The proceeding paths of the first laser light LB1 and the second laser light LB2 output from the laser light source 100 are reversed up and down while passing through dove prism 830. In other words, the phase of the laser light output from the laser light source 100 may be reversed up and down while passing through the dove prism 830.

While exemplary embodiments of the present invention have been shown and described above, it will be understood by those of ordinary skill in the art that various changes in form and details may be made therein without departing from the spirit and scope of the present invention, as defined by the following claims.

What is claimed is:

1. A laser light source, comprising:
an airtight container; and
a first resonance mirror and a second resonance mirror outside the airtight container,
wherein the first resonance mirror includes a lens unit and a reflection coating layer,
the lens unit includes a first surface and a second surface,
the first surface is disposed between the airtight container and the second surface, and
the first surface of the lens unit of the first resonance mirror is spiral.

2. The laser light source of claim 1, wherein
the reflection coating layer is disposed on the second surface of the lens unit of the first resonance mirror.

3. The laser light source of claim 1, wherein
the reflection coating layer is disposed inside the lens unit between the first surface and the second surface of the lens unit.

4. The laser light source of claim 1, wherein
the reflection coating layer is disposed on the first surface of the lens unit of the first resonance mirror.

5. The laser light source of claim 1, wherein
the second resonance mirror includes a third surface and a fourth surface and
wherein the fourth surface is inclined with respect to the third surface.

6. A laser light source, comprising:
an airtight container; and
a first resonance mirror and a second resonance mirror outside the airtight container,
wherein
the first resonance mirror includes a lens unit and a reflection coating layer,
the lens unit includes a first surface and a second surface,
the first surface is disposed between the airtight container and the second surface,
the first surface of the lens unit includes a first inclined surface and a second inclined surface, and
the first inclined surface and the second inclined surface are not parallel.

7. The laser light source of claim 6, wherein
the reflection coating layer is disposed on the second surface of the lens unit of the first resonance mirror.

8. The laser light source of claim 6, wherein
the reflection coating layer is disposed inside the lens unit between the first surface and the second surface of the lens unit.

9. The laser light source of claim 6, wherein
the reflection coating layer is disposed on the first surface of the lens unit of the first resonance mirror.

10. The laser light source of claim 6, wherein
a part where the first inclined surface and the second inclined surface of the lens unit meet has a minimum thickness of the lens unit in a direction perpendicularly extending from the second surface.

11. The laser light source of claim 10, wherein
an angle formed between the first inclined surface and the second inclined surface is greater than 180° and less than 360°.

12. The laser light source of claim 6, wherein
a part where the first inclined surface and the second inclined surface of the lens unit meet has a maximum thickness of the lens unit in a direction perpendicularly extending from the second surface.

13. The laser light source of claim 12, wherein
an angle formed between the first inclined surface and the second inclined surface is greater than 0° and less than 180°.

14. The laser light source of claim 6, wherein
the second resonance mirror includes a third surface and a fourth surface and
wherein the fourth surface is inclined with respect to the third surface.

15. A laser light source, comprising:
an airtight container; and
a first resonance mirror and a second resonance mirror outside the airtight container,
wherein
the first resonance mirror includes a lens unit and a reflection coating layer, the lens unit includes a first surface and a second surface, the first surface is disposed between the airtight container and the second surface, the first surface of the lens unit includes a first inclined surface, a second inclined surface, a third inclined surface and a fourth inclined surface, and the first inclined surface, the second inclined surface, the third inclined surface and the fourth inclined surface are not parallel.

16. The laser light source of claim 15, wherein the reflection coating layer is disposed on the second surface of the lens unit of the first resonance mirror.

17. The laser light source of claim 15, wherein the reflection coating layer is disposed inside the lens unit between the first surface and the second surface of the lens unit.

18. The laser light source of claim 15, wherein the reflection coating layer is disposed on the first surface of the lens unit of the first resonance mirror.

19. The laser light source of claim 15, wherein a point where the first inclined surface, the second inclined surface, the third inclined surface, and the fourth inclined surface of the lens unit all meet has a minimum thickness of the lens unit in a direction perpendicularly extending from the second surface.

20. The laser light source of claim 15, wherein a point where the first inclined surface, the second inclined surface, the third inclined surface, and the fourth inclined surface of the lens unit all meet has a maximum thickness of the lens unit in a direction perpendicularly extending from the second surface.

\* \* \* \* \*